(12) United States Patent
Liang et al.

(10) Patent No.: US 11,799,488 B2
(45) Date of Patent: Oct. 24, 2023

(54) METHOD OF REDUCING CONDUCTION LOSS AND SWITCHING LOSS APPLIED IN DRIVING CIRCUIT AND DRIVING CIRCUIT USING THE SAME

(71) Applicant: xMEMS Labs, Inc., Santa Clara, CA (US)

(72) Inventors: Jemm Yue Liang, Sunnyvale, CA (US); Jing-Meng Liu, San Jose, CA (US); Hsi-Sheng Chen, Fremont, CA (US)

(73) Assignee: xMEMS Labs, Inc., Santa Clara, CA (US)

( * ) Notice: Subject to any disclaimer, the term of this patent is extended or adjusted under 35 U.S.C. 154(b) by 0 days.

(21) Appl. No.: 18/051,015

(22) Filed: Oct. 31, 2022

(65) Prior Publication Data

US 2023/0155597 A1    May 18, 2023

Related U.S. Application Data

(60) Provisional application No. 63/269,041, filed on Mar. 8, 2022, provisional application No. 63/280,962, filed on Nov. 18, 2021.

(51) Int. Cl.
| | | |
|---|---|---|
| H03M 7/00 | (2006.01) | |
| H03M 1/00 | (2006.01) | |
| H03M 1/18 | (2006.01) | |
| H03M 1/38 | (2006.01) | |

(52) U.S. Cl.
CPC ............. *H03M 1/002* (2013.01); *H03M 1/182* (2013.01); *H03M 1/38* (2013.01)

(58) Field of Classification Search
CPC ......... H03M 1/12; H03M 5/08; H03M 1/0607; H03M 1/1009; H03M 3/498; H03M 3/506; H02M 3/1582; H02M 3/155; H02M 1/08; H02M 1/14; H02M 3/157; H02M 3/158; H03F 1/0205; H03F 2200/03; H03F 3/183; H03F 3/187; H03F 3/2171; H04R 17/00; H04R 3/00
USPC ... 341/61, 139, 142, 155; 323/222, 282, 224, 323/284

See application file for complete search history.

(56) References Cited

U.S. PATENT DOCUMENTS

| | | | | |
|---|---|---|---|---|
| 6,088,243 | A * | 7/2000 | Shin ....................... | H02J 9/005 363/21.05 |
| 6,166,527 | A * | 12/2000 | Dwelley et al. .... | H02M 3/1582 323/283 |
| 6,191,567 | B1* | 2/2001 | Sluijs ................. | H02M 3/1582 323/283 |
| 6,215,286 | B1* | 4/2001 | Scoones et al. ...... | H02M 3/156 323/284 |
| 6,348,779 | B1* | 2/2002 | Sluijs ................. | H02M 3/1582 363/19 |
| 6,984,967 | B2* | 1/2006 | Notman ............. | H02M 3/1582 323/283 |

(Continued)

*Primary Examiner* — Linh V Nguyen
(74) *Attorney, Agent, or Firm* — Winston Hsu (57) ABSTRACT

A method, which is applied in a driving circuit including an analog-to-digital convertor (ADC) and a switching circuit including an inductor and coupled to a load, includes steps of: performing an analog-to-digital conversion on a load voltage of the load at a first rate; and producing at least a current pulse flowing through the inductor at a second rate. Wherein, each current pulse among the at least a current pulse is accomplished within a second cycle corresponding to the second rate, all of the at least a current pulse are accomplished within a first cycle corresponding to the first rate, and a first length of the first cycle is longer than twice of a second length of the second cycle.

29 Claims, 10 Drawing Sheets

(56) References Cited

U.S. PATENT DOCUMENTS

| | | | | |
|---|---|---|---|---|
| 7,391,190 B1* | 6/2008 | Rajagopalan | ....... | H02M 3/1582 |
| | | | | 323/283 |
| 7,609,040 B1* | 10/2009 | Jain | ................ | H02M 3/1584 |
| | | | | 323/283 |
| 7,923,980 B2* | 4/2011 | Takahashi et al. | .... | H02M 3/157 |
| | | | | 323/283 |
| 8,975,826 B1* | 3/2015 | Stevens | ............... | H05B 45/375 |
| | | | | 315/307 |
| 8,976,543 B1* | 3/2015 | Zheng et al. | ..... | H02M 3/33573 |
| | | | | 363/17 |
| 2022/0021305 A1* | 1/2022 | Dearborn et al. | ... | H02M 1/0012 |
| 2022/0209647 A1* | 6/2022 | Yamada | ................ | H02M 1/08 |

* cited by examiner

METHOD OF REDUCING CONDUCTION LOSS AND SWITCHING LOSS APPLIED IN DRIVING CIRCUIT AND DRIVING CIRCUIT USING THE SAME

CROSS REFERENCE TO RELATED APPLICATIONS

This application claims the benefit of U.S. Provisional Application No. 63/280,962, filed on November 18th, 2021. Further, this application claims the benefit of U.S. Provisional Application No. 63/269,041, filed on March 8th, 2022. The contents of these applications are incorporated herein by reference.

BACKGROUND OF THE INVENTION

1. Field of the Invention

The present invention relates to a method applied in a driving circuit, and more particularly, to a method applied in a driving circuit capable of reducing conduction loss and switching loss, especially for an audio system.

2. Description of the Prior Art

Recently, piezoelectric-actuated speakers (piezo-speakers) have emerged. Due to the capacitive nature of thin film piezoelectric actuators, these piezo-speakers present highly capacitive loads to the amplifiers. However, conventional driving circuits, such as class-AB, -D, -G, -H amplifiers, have all evolved assuming the loading (coils made of very fine metal wires) will be mostly resistive and slightly inductive, and these conventional amplifiers are not suitable to drive the highly capacitive loads such as piezo-speakers.

In order to minimize power consumption, two-way direct-current to direct-current (DC-DC) converter has been therefore developed both to supply electric power to and to recycle electric power from a piezo-speaker, and it is necessary to make the power loss thereof as low as possible. There are mainly two types of power losses possessed in the DC-DC converter: conduction loss and switching loss. The conduction loss is generated when a current passes through the turned-on resistance of the transistors (operating as switch elements) in the DC-DC converter; hence, the conduction loss is larger under a higher current value. The switching loss is generated from switching of the switch elements (e.g., driving gates of MOSFET to $V_{ON}$ or $V_{OFF}$) in the DC-DC converter, where a certain amount of power loss is generated in each switching operation regardless of the current magnitude passing through the switch elements.

During the switching operations of the DC-DC converter, both the conduction loss and the switching loss are unavoidable. Thus, there is a need to minimize the overall power consumption by achieving a balance between the conduction loss and the switching loss.

SUMMARY OF THE INVENTION

It is therefore an objective of the present invention to provide a method applied in a driving circuit for driving a DC-DC converter, where the PWM signals for controlling the DC-DC converter may be well arranged to achieve the balance between the conduction loss and the switching loss, so as to minimize the power consumption of the acoustic system.

An embodiment of the present invention discloses a method applied in a driving circuit comprising an analog-to-digital convertor (ADC) and a switching circuit comprising an inductor and coupled to a load. The method comprises steps of: performing an analog-to-digital conversion on a load voltage of the load at a first rate; and producing at least a current pulse flowing through the inductor at a second rate. Wherein, each current pulse among the at least a current pulse is accomplished within a second cycle corresponding to the second rate, all of the at least a current pulse are accomplished within a first cycle corresponding to the first rate, and a first length of the first cycle is longer than twice of a second length of the second cycle.

Another embodiment of the present invention discloses a driving circuit configured to drive a load. The driving circuit comprises an analog-to-digital convertor (ADC) and a switching circuit. The ADC is configured to perform an analog-to-digital conversion on a load voltage of the load at a first rate. The switching circuit, comprising an inductor and coupled to a load, is configured to produce at least a current pulse flowing through the inductor at a second rate. Wherein, each current pulse among the at least a current pulse is accomplished within a second cycle corresponding to the second rate, all of the at least a current pulse are accomplished within a first cycle corresponding to the first rate, and a first length of the first cycle is longer than twice of a second length of the second cycle.

These and other objectives of the present invention will no doubt become obvious to those of ordinary skill in the art after reading the following detailed description of the preferred embodiment that is illustrated in the various figures and drawings.

DETAILED DESCRIPTION

U.S. Pat. No. 11,290,015 and No. 11,336,182 have disclosed driving circuit which includes DC-DC converter as switching circuit to drive capacitive loads, especially applied for driving the capacitive speaker loads within the piezo-speakers. The DC-DC converter would consume conduction loss and switching loss. The driving circuit in the present invention attempts to minimize the conduction loss and switching loss.

Figure 1:
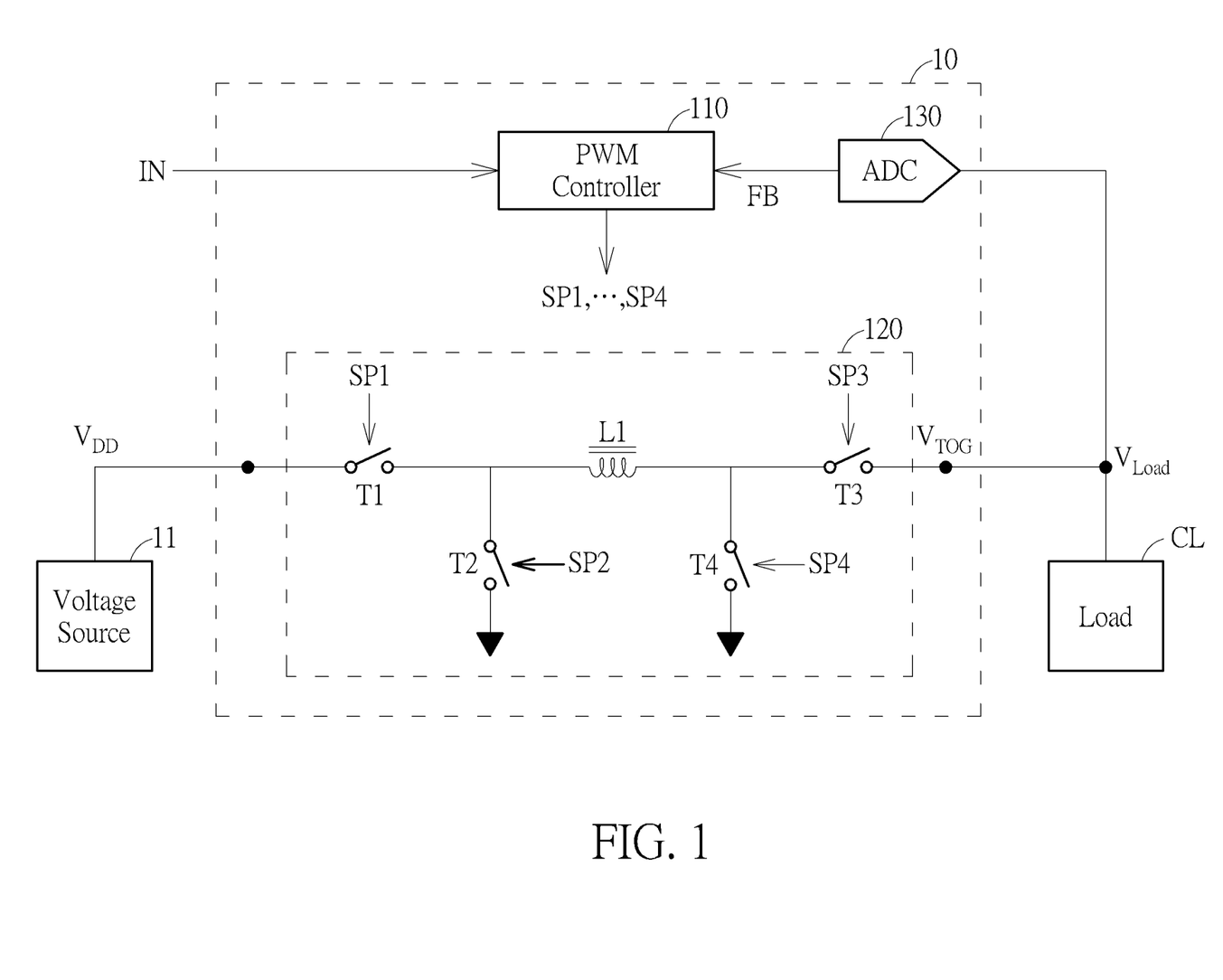
FIG. 1 is a schematic diagram of a driving circuit according to an embodiment of the present invention.

FIG. 1 is a schematic diagram of a driving circuit 10 according to an embodiment of the present invention. The driving circuit 10 is configured to drive a load CL according to an input signal IN and includes a pulse width modulation (PWM) controller 110, a switching circuit 120 and an analog-to-digital converter (ADC) 130. The switching circuit 120, coupled between a voltage source (or called a power source, could be a battery) 11 and the load CL, includes an inductor L1 and switches T1-T4. The switching circuit 120 is controlled by PWM signals SP1-SP4 generated by the PWM controller 110 to perform direct-current to direct-current (DC-DC) operations between voltage source 11 and the load CL, so as to control the voltage across the load CL. Herein, the DC-DC operation may be referred to a charging operation forming a current flowing toward the load CL or a discharging operation forming another current flowing from the load CL. The load CL herein may be a predominantly capacitive load. In general, the charging operation performed on the load results in an increment on a load voltage of the load; while the discharging operation performed on the load results in a decrement on the load voltage of the load.

The ADC 130 is configured to perform an analog-to-digital conversion on a load voltage of the load at a rate of $1/T_{ADC}$, where $T_{ADC}$ denotes an interval/cycle between two consecutive (sampling instants of) analog-to-digital conversions. The load voltage of the load may be referred to $V_{Load}$ shown in FIG. 1. The rate $1/T_{ADC}$ may be known as sampling frequency of ADC in terms of samples-per-second or simply Hz, or called ADC frequency/rate.

The switching circuit 120, controlled by the PWM signals SP1-SP4 generated by the PWM controller 110, is configured to perform DC-DC operation(s) via producing current pulse(s) flowing throw the inductor L1 at a rate of $1/T_{DC\text{-}DC}$. The rate $1/T_{DC\text{-}DC}$ may be called DC-DC operating frequency/rate, and $T_{DC\text{-}DC}$ denotes a DC-DC cycle or a length of the DC-DC cycle. In the present invention, performing one DC-DC operation refers to producing one current pulse flowing through the inductor L1, and producing current pulse(s) at the DC-DC operating rate $1/T_{DC\text{-}DC}$ means that each current pulse is accomplished within one DC-DC cycle $T_{DC\text{-}DC}$.

In the present invention, for inductor compactness reason and ADC power consumption reason, the DC-DC operating rate of the switching circuit (e.g., 120) is higher than the ADC rate of the ADC, which is detailed as follows.

For inductor compactness reason, in order to reduce a size of the inductor L1 for circuit compactness and reduce a peak current to lower conduction loss, it is generally desirable to increase the DC-DC operating rate. For example, for the switching circuit 120 based on a mainstream semiconductor foundry manufacturing process, it is feasible to design and operate efficiently with the DC-DC operating rate around 3 MHz. Hence, from the perspectives of power efficiency and compactness of the driving circuit 10, it is both feasible and desirable to configure the switching circuit 120 to operate at high DC-DC operating rate, such as 3.072 MHz, but not limited thereto.

On the other hand, for ADC power consumption reason, the power consumed by ADC is related to its resolution and its conversion rate: the higher is the resolution, the more power will be consumed, and the higher is the conversion rate, the more power will be consumed. In sound producing application, an original audio input signal is typically band limited to human audible frequencies between 16.5 Hz to 22 KHz. For such band limited input, there is rare benefit in raising the sampling/conversion rate of ADC (i.e., the ADC rate) to the realm of 3 MHz or as high as the DC-DC operating rate. That is, from the perspective of reducing ADC power, the ADC rate can be reduced to be (e.g., a few times) lower than the DC-DC operating rate.

In an embodiment, the switching circuit 120 may operate in the DC- DC operating rate as 3.072 MHz or 1.536 MHz, while the ADC 130 may operate in a lower/ADC rate such as 384 kHz or 768 kHz. In such a situation, one ADC cycle may contain a plurality of (e.g., 4 or 8) DC-DC cycles of the switching circuit 120. In the present application, (a first length of) the ADC cycle $T_{ADC}$ shall be at least longer than twice of (a second length of) the DC-DC cycle $T_{DC\text{-}DC}$.

Figure 2:
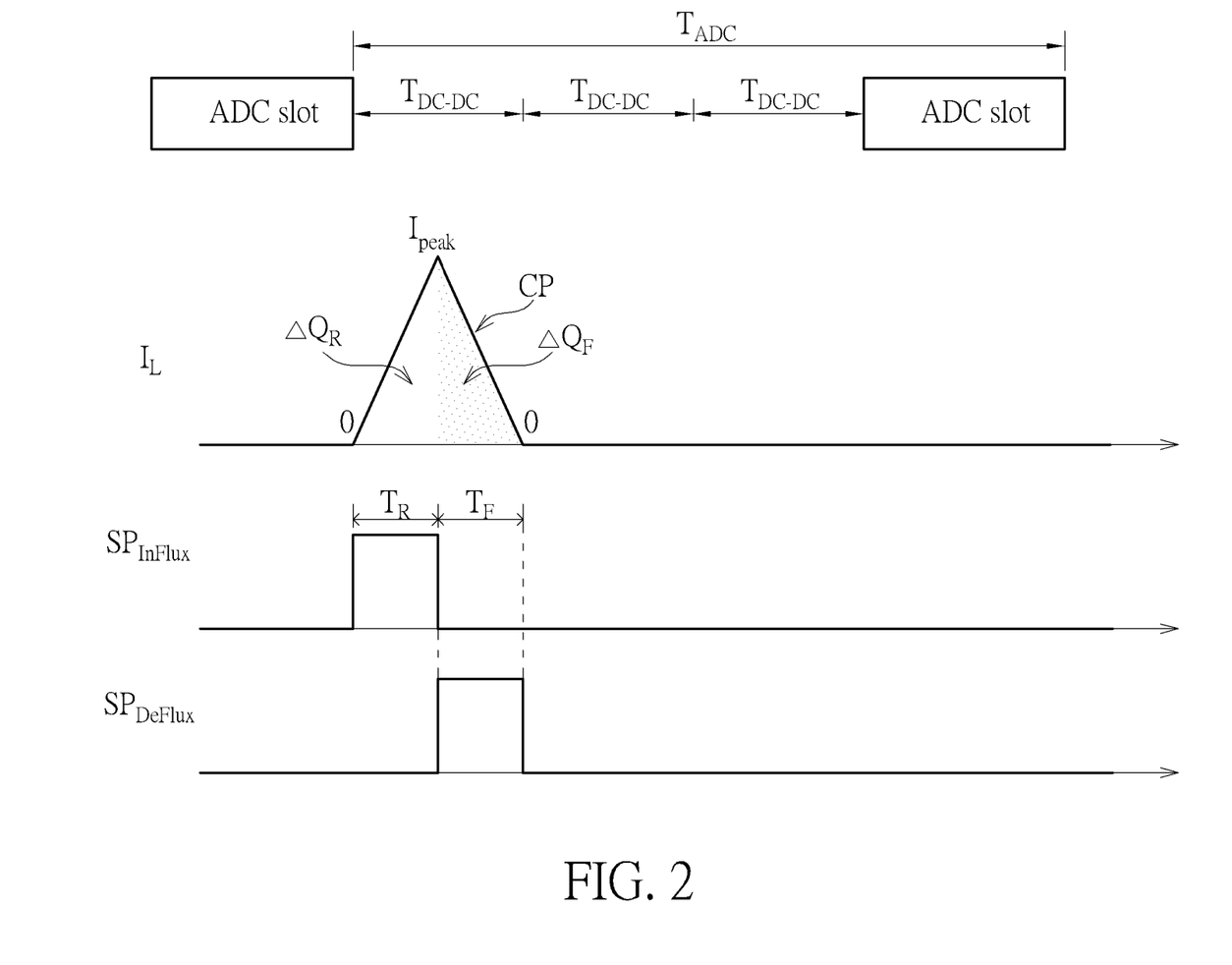
FIG. 2 demonstrates an embodying operation of the driving circuit operating in an ADC frequency and a DC-DC operating frequency.

Illustratively, FIG. 2 demonstrates an embodying operation of the driving circuit 10 operating in the ADC frequency as $1/T_{ADC}$ and the DC-DC operating frequency as $1/T_{DC\text{-}DC}$. In the case of the ADC frequency being 384 kHz and the DC-DC operating frequency 1.536 MHz, the ADC cycle $T_{ADC}$ is $T_{ADC} = 4 \cdot T_{DC\text{-}DC}$. That is, the ADC cycle $T_{ADC}$ can be divided into four time slots. Three of the four time slots can be used for the DC-DC operation(s), and one of the time slots or the final time slot can be used for performing the analog-to-digital conversion, which is annotated as "ADC slot" in FIG. 2.

In FIG. 2, waveforms of an inductor/conduction current $I_L$, PWM signals $SP_{InFlux}$ and $SP_{DeFlux}$ for performing one DC-DC operation are illustrated. The current $I_L$ represents a magnitude of the current flowing through the inductor L1, regardless of current direction. That is, $I_L$ may represent the inductor/conduction current either flowing from a first terminal of the inductor L1 (connected to the switches T1-T2) to a second terminal of the inductor L1 (connected to the switches T3-T4) for the charging operation, or flowing from the second terminal to the first terminal for the discharging operation.

As shown in FIG. 2, the current pulse CP initiates from a time instant at which $I_L=0$, experiences a rising segment/interval $T_R$ during which the current $I_L$ increases, reaches a peak current where $I_L=I_{peak}$, experiences a falling segment/interval $T_F$ during which the current $I_L$ decreases, and ends at a time instant at which $I_L=0$. The rising segment/interval $T_R$ corresponds to an InFlux (flux-increasing) phase of the DC-DC operation and the falling segment/interval $T_F$ corresponds to a DeFlux (flux-decreasing) phase of the DC-DC operation. Note that, as shown in FIG. 2, the current pulse CP is accomplished within one of the DC-DC cycle, spanning a time window of $T_{DC\text{-}DC}$, and shall be referred to as: the switching circuit 120 produces the current pulse CP at the DC-DC operating rate $1/T_{DC\text{-}DC}$.

For illustrative purpose, the current pulse CP in FIG. 2 is illustrated as triangular. In reality, waveform(s) of the current $I_L$ between $I_L=0$ and $I_L=I_{peak}$ may be slightly deviated from straight line(s), but can be approximated as linear or straight line(s), especially when the interval $T_R/T_F$ (or the pulse width of the PWM signal $SP_{InFlux}/SP_{DeFlux}$) is sufficiently small.

The PWM signal $SP_{InFlux}$ can be applied as two of the PWM signals SP1-SP4 for InFlux phase, and the PWM signal $SP_{DeFlux}$ can be applied as the other two of the PWM signals SP1-SP4 for DeFlux phase. For example, the DC-DC operation of the switching circuit 10, taught in U.S. Pat. No. 11,336,182, may be briefed as below. Within an ADC cycle $T_{ADC}$ for the charging operation, the PWM signal $SP_{InFlux}$ may be applied on the switches, e.g., T1 and T4 (i.e., SP1 = SP4 = $SP_{InFlux}$), to transfer electric energy stored in the voltage source 11 into magnetic flux energy stored in the inductor L1 during the InFlux phase, and the PWM signal $SP_{DeFlux}$ may be applied on the switches, e.g., T2 and T3

(i.e., SP2 = SP3 = $SP_{DeFlux}$), to transfer magnetic flux energy stored in the inductor L1 into electric energy in the load CL during the DeFlux phase. Within an ADC cycle $T_{ADC}$ for the discharging operation, the PWM signal $SP_{InFlux}$ may be applied on the switches, e.g., T2 and T3 (i.e., SP2 = SP3 = $SP_{InFlux}$), to transfer electric energy stored in the load CL into magnetic flux energy in the inductor L1 during the InFlux phase, and the PWM signal $SP_{DeFlux}$ may be applied on the switches, e.g., T1 and T4 (i.e., SP1 = SP4 = $SP_{DeFlux}$), to transfer magnetic flux energy stored in the inductor L1 into electric energy in the voltage source 11 during the DeFlux phase. Other details of the DC-DC operation may be referred to U.S. Pat. No. 11,336,182.

When a charging operation is performed by the switching circuit 10, a shaded area under the falling segment of the current pulse CP in FIG. 2 (i.e., an area of the shaded right-half triangle within the waveform of the current pulse CP), whose area is denoted as $\Delta Q_F$, represents a quantity of electric charges (to be) injected/transferred into the capacitive load CL during the charging operation. When a discharging operation is performed by the switching circuit 10, a blank area under the rising segment of the current pulse CP in FIG. 2 (i.e., an area of the blank left-half triangle within the waveform of the current pulse CP), whose area is denoted as $\Delta Q_R$, represents a quantity of electric charges (to be) recovered/transferred out from the capacitive load CL during the discharging operation.

The quantity of electric charges to be transferred to/from the capacitive load CL, generally denoted as $\Delta Q$, would result in a voltage change/difference, denoted as $\Delta V_{Load}$. The larger is the electric charges $\Delta Q$, the larger will be the voltage change/difference $\Delta V_{Load}$, and their relationship can be expressed as $\Delta Q/CL = \Delta V_{Load}$. The quantity of electric charges $\Delta Q$ is controlled by the interval $T_R/T_F$ via the pulse width of the PWM signal $SP_{InFlux}/SP_{DeFlux}$. If there is only one single current pulse CP within the ADC cycle $T_{ADC}$ and a large quantity of electric charges is required, a high peak current $I_{peak}$ would be generated.

However, since $P \propto I^2 R$, higher peak current results in fast rising conduction loss, a power consumed due to a current flowing through the switches, which may be realized by MOSFET (metal-oxide-semiconductor field-effect transistor), with turn-on resistances $R_{ON}$.

Figure 3:
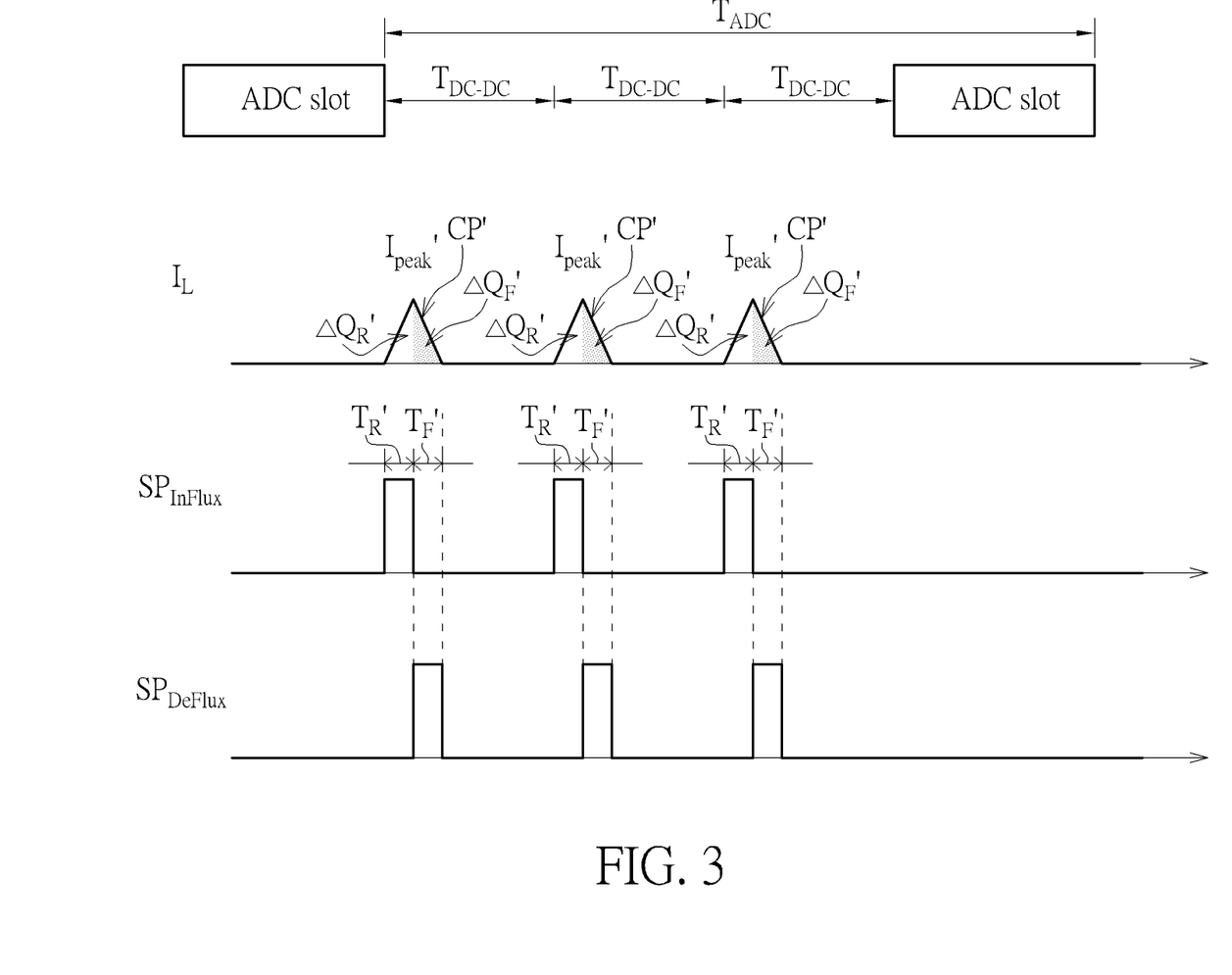
FIG. 3 demonstrates an embodying operation of the driving circuit operating in an ADC frequency and a DC-DC operating frequency.

Alternatively, in order to minimize the high conduction loss, multiple pulses CP may be produced within one ADC cycle $T_{ADC}$ to transfer the required quantity of electric charges. For example, in FIG. 3, three (alternative) current pulses CP' are produced within one ADC cycle $T_{ADC}$, where each current pulse CP' is accomplished within one DC-DC cycle $T_{DC-DC}$ as well. If the current producing scheme of FIG. 3 is designed to achieve (substantially) the same $\Delta V_{Load}$ or the same $\Delta Q$ as which of FIG. 2 (e.g., $\Delta Q_R = 3 \cdot \Delta Q_R'$ and/or $\Delta Q_F = 3 \cdot \Delta Q_F'$), the peak current $I_{peak}'$ in the scheme of FIG. 3 might be less than which in the scheme of FIG. 2, and thereby conduction loss is reduced compared to the scheme of FIG. 2. Specifically, the peak current $I_{peak}'$ in the scheme of FIG. 3 becomes ⅓ in the scheme of FIG. 2, thereby reducing the conduction loss to $3 \cdot (⅓)^2 = ⅓$ of the scheme of FIG. 2.

In addition to conduction loss, switching loss is another type of energy consumed (or dissipated) by DC-DC switching circuit such as the switching circuit 120. Different from the conduction loss related to the turn-on resistance $R_{ON}$ of MOSFET as the switches, the switching loss, related to charging/discharging the gate capacitance ($C_G = C_{GS} + C_{GD}$) of the MOSFET, is essentially constant every time the switch is turned ON/OFF. Note that, larger MOSFET with lower $R_{ON}$ may cause less conduction loss but higher switching loss since gate capacitance $C_G$ is proportional to a size/area of the MOSFET.

Specifically, for half of the DC-DC operation (corresponding to either the InFlux phase or DeFlux phase), the conduction loss of half DC-DC operation may be expressed as $W_{CND} = R_{ON} \cdot \int_0^{t_{PWM}} I_L^2(t) dt$, where $t_{PWM}$ herein may represent $T_R$ (for InFlux phase) or $T_F$ (for DeFlux phase). For a given implementation of DC-DC/switching circuit 120, the conduction loss $W_{CND}$ can be expressed as $W_{CND} \propto t_{PWM}^3$. Therefore, the conduction loss of each DC-DC cycle operation $W_{CND}$ is related to $t_{PWM}^3$ while the switching loss $W_{SW}$ is independent of $t_{PWM}$.

By trading off between $W_{CND}$ and Wsw, the PWM controller 110 may control the switching circuit to produce an appropriate number of current pulse(s) within the ADC cycle to minimize the total power consumption of conduction loss and switching loss. In general, more current pulses are required when high electric charges are to be injected into or recovered from the capacitive load CL, and fewer current pulses are preferable when low electric charges are to be injected into or recovered from the capacitive load CL. Therefore, the PWM controller 110 may determine the number of current pulses in the ADC cycle based on the quantity of electric charges needed to be transferred to/from the capacitive load CL via the switching circuit 120.

In short, under a scheme of $T_{ADC} = (N+1) \cdot T_{DC-DC}$ or of the DC-DC operating rate being (N+1) times the ADC rate, for a certain quantity of electric charge $\Delta Q$ to be transferred over one ADC $T_{ADC}$, a current-pulse number K may be determined/optimized such that the conduction loss and the switching loss of producing K current pulses within one ADC cycle $T_{ADC}$ is minimized, where K ≤ N, and K, N are integers.

Figure 4:
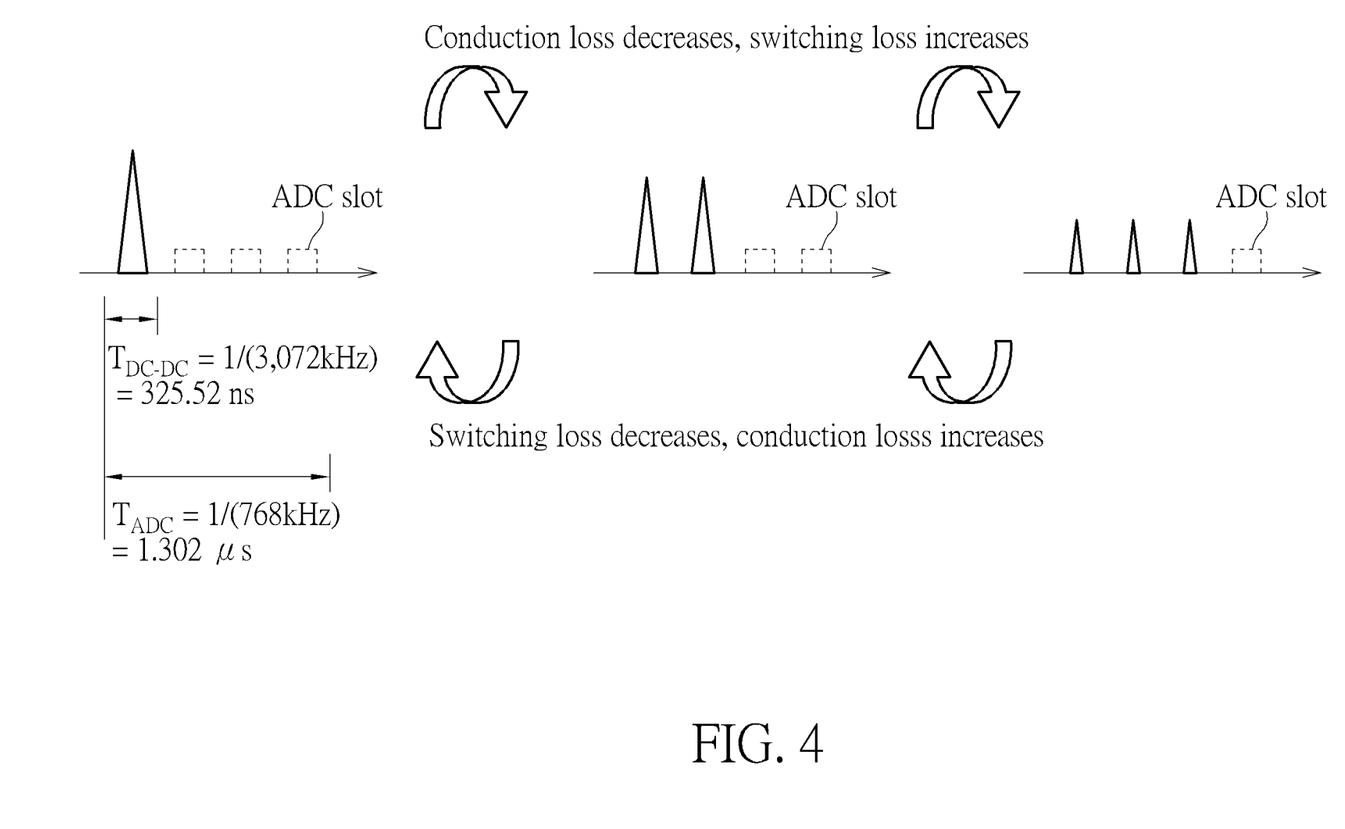
FIG. 4 is a schematic diagram of pulse control in an ADC cycle according to embodiment(s) of the present invention.

FIG. 4 is a pulse control scheme within the ADC cycle $T_{ADC}$ of the present invention. As shown in FIG. 4, the number of current pulses may be adjusted according to the quantity of electric charges corresponding to the currents flowing in the switching circuit 120. In an embodiment, the ADC may operate in 768 kHz and thus the length of an ADC cycle $T_{ADC}$ is 1/768 KHz ≈ 1.302 µs. The switching circuit 120 may operate with the length of a DC-DC cycle $T_{DC-DC}$ of 1/(4·768 KHz) = ⅓,072 KHz ≈ 325.52 ns. In such a situation, one ADC cycle $T_{ADC}$ contains 4 DC-DC cycles $T_{DC-DC}$.

FIG. 4 illustrates three possible implementations/embodiments under the configuration of operating frequencies. In the 1st implementation (shown in the leftmost of FIG. 4), only one current pulse is produced within one ADC cycle $T_{ADC}$. As a required charge quantity increases, the width of PWM pulses generated by PWM Controller 110 widens, resulting in the conduction power loss $W_{CND}$ to rise rapidly at the rate of $T_{PWM}^3$. Therefore, in order to lower the conduction loss, when the required charge quantity is greater than a first quantity threshold, it is maybe desirable to accomplish the transfer of charge $\Delta Q$ through more than one current pulse within the ADC cycle $T_{ADC}$. For instance, in the 2nd implementation (shown in the middle of FIG. 4), two current pulses with lower peak current are produced within the ADC cycle $T_{ADC}$. Note that, the total conduction loss $W_{CND}$ consumed by the two current pulses in the 2nd implementation may be decreased at the expense of doubling the switching loss Wsw. The 2nd implementation is preferable compared to the 1st implementation when a reduction of conduction loss $W_{CND}$ by producing two current pulses is more than the incremental switching loss Wsw caused by (the) additional current pulse.

Similarly, when the required charge quantity further increases to be greater than a second quantity threshold, it may be preferable to produce three current pulses within one ADC cycle $T_{ADC}$, as the 3$^{rd}$ implementation shown in the rightmost of FIG. 4, which leads to a further reduction of conduction loss at expense of tripling the switching loss Wsw.

Conversely, when the required charge quantity ΔQ falls below the second or the first quantity threshold mentioned previously, the number of current pulse(s) may be lowered to reduce the switching loss $W_{SW}$ such that the overall energy loss of DC-DC switching circuit 120, $W_{CND}+W_{SW}$, may be reduced.

Therefore, according to the overall charge quantities ΔQ (which may be determined based on the desired/intended voltage difference of the capacitive load CL), the driving circuit 10 may determine the number of current pulses included within the ADC cycle $T_{ADC}$, so as to minimize the total power consumption caused by the switching loss and the conduction loss.

In addition, the overall charge quantities can be determined by intended voltage difference within one ADC cycle. According to the well-known formula of Q = CV (eq. 1), the required charge quantity $\Delta Q^{(r)}$, the quantity of electric charges required to be transferred to/from the capacitive load CL within one ADC cycle $T_{ADC}$, depends on an intended voltage difference $\Delta V^{(int)}$ on capacitive load CL within the ADC cycle $T_{ADC}$. The intended voltage difference $\Delta V^{(int)}$ may be obtained from an input signal IN and a feedback signal FB received by the PWM controller 110. Specifically, the intended voltage difference $\Delta V^{(int)}$ may be determined according to a difference between the input signal IN and the feedback signal FB corresponding to the cycle $T_{ADC}$. Specifically, $\Delta Q^{(r)} = C_{CL} \cdot \Delta V^{(int)}$, where $C_{CL}$ denotes the capacitance of the load CL shown in FIG. 1.

That is, within one ADC cycle $T_{ADC}$, the PWM controller 110 may control the switching circuit 120 to produce more than one current pulses CP when the difference between the input signal IN and the feedback signal FB is greater than a threshold TH. Furthermore, the PWM controller 110 may determine to increase the current-pulse number K when the difference between the input signal IN and the feedback signal FB is greater than a first threshold TH1, and control the switching circuit 120 to produce the current pulses CP flowing through the inductor L1 at the DC-DC operating rate 1/$T_{DC-DC}$ with the increased current-pulse number K+ (where K+ > K). On the other hand, the PWM controller 110 may determine to decrease the current-pulse number K when the difference between the input signal IN and the feedback signal FB is less than a second threshold TH2, and control the switching circuit 120 to produce the current pulses CP flowing through the inductor L1 at the DC-DC operating rate 1/$T_{DC-DC}$ with the decreased current-pulse number K- (where K- < K).

In an embodiment, the load CL herein may be a capacitive speaker load, e.g., a piezo-actuated speaker. The driving circuit 10 may receive an input signal IN which is generated according to an original audio signal within an audible band (e.g., between 16.5 Hz to 22 KHz). The driving circuit drives the capacitive speaker load according to the input signal IN, such that an output voltage of the driving circuit 10 for driving the capacitive speaker load $V_{Load}$ is substantially proportional to the input signal IN. A signal a being substantially proportional to a signal b may imply that, $\| a(t) - c \cdot b(t) \|^2 \leq \varepsilon$ is satisfied, where $\| s(t) \|^2$ may represent an energy of an arbitrary signal s(t), a(t) and b(t) represent time-varying function of the signal a and the signal b, respectively, c represents a constant which can be either positive or negative, and ε represent some positive small number which may be, e.g., 10$^{-1}$, 10$^{-2}$, 10$^{-3}$, etc.

The thresholds TH, TH1 and TH2 mentioned above are determined according to practical operating condition. In some circumstances, the capacitance $C_{CL}$ of the capacitive load CL may vary with respect to the load voltage $V_{Load}$. For example, due to the nature of piezo material, permittivity or capacitance of piezo-speaker ($C_{CL}$) decreases as the voltage applied thereon ($V_{Load}$) increases. In general, for a certain given load voltage $V_{Load}$, the larger is the intended voltage difference $\Delta V^{(int)}$, the more the current-pulse number K will be. Conversely, for certain given load voltage $V_{Load}$, the smaller is the intended voltage difference $\Delta V^{(int)}$, the less the current-pulse number K will be.

In an embodiment, the input signal IN may be a digital signal and corresponding to a sampling rate the same as the ADC rate 1/$T_{ADC}$. For example, in an embodiment, for the ADC rate of 384 KHz or 768 KHz, the input signal IN may be generated via an up-sampling process according to an input digital audio signal of 48 KHz sample rate.

Figure 5:
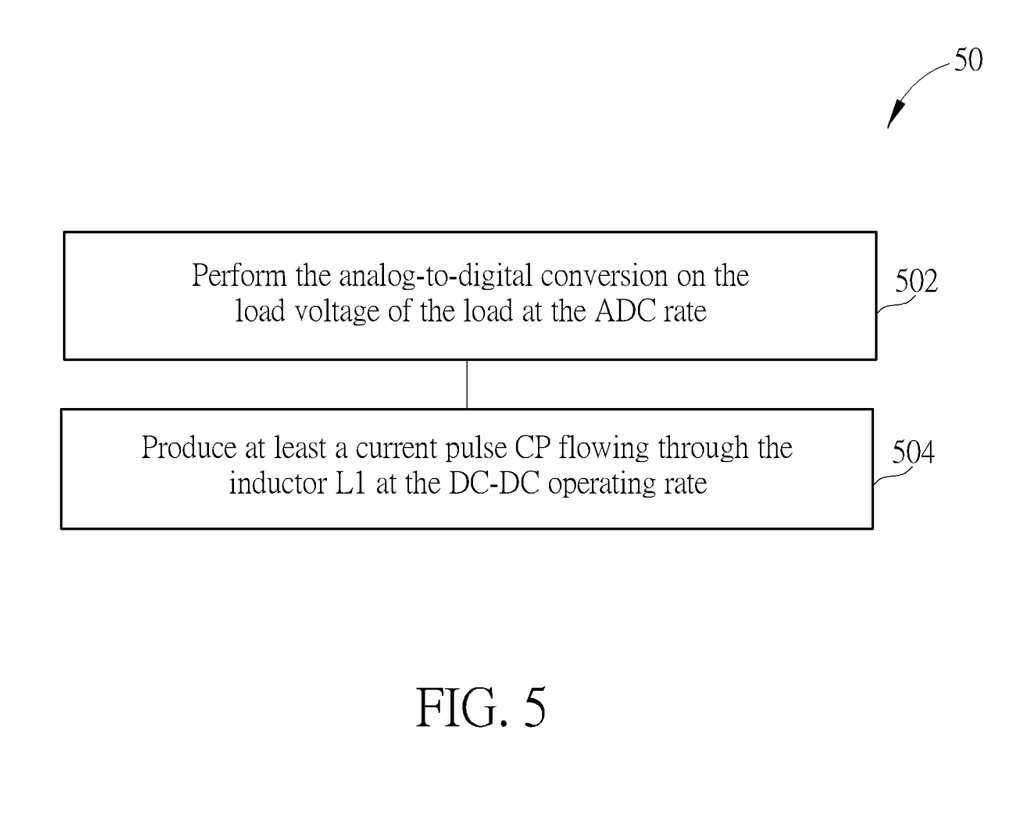
FIG. 5 is a flowchart of a process according to an embodiment of the present invention.

Operations of the driving circuit 10 may be summarized as a process 50 shown in FIG. 5. The process 50 comprises the following steps.

Step 502: Perform the analog-to-digital conversion on the load voltage $V_{Load}$ of the load at the ADC rate.

Step 504: Produce at least a current pulse CP flowing through the inductor L1 at the DC-DC operating rate.

In the process 50, the DC-DC operating rate is larger than the ADC rate in general. A ratio of the DC-DC operating rate to the ADC rate is not limited. For purpose of reducing conduction loss, reserving more than one DC-DC cycle within one ADC cycle is suggested, in order to offload the required charge quantity. That is, in the present invention, the ADC cycle $T_{ADC}$ is suggested to be at least longer than twice of the DC-DC cycle $T_{DC-DC}$.

U.S. Pat. No. 11,271,480 and Application No. 18/048,852 filed by Applicant teach that the PWM controller receives input signal IN and feedback signal FB, obtains an address according to the input signal IN and feedback signal FB, fetches a pulse width control code (PWCC) from a lookup table (LUT) stored in a memory according to the address, and generates a PWM signal (e.g., $SP_{InFlux}$ or $SP_{DeFlux}$ shown in FIG. 2) with pulse width corresponding to the PWCC, so as to use the PWM signal corresponding to the PWCC to control the operation of the switching circuit (or bidirectional circuit under the context of both applications).

In general, the PWM controller may obtain a first PWCC to generate the PWM signal $SP_{InFlux}$ for InFlux phase and a second PWCC to generate the PWM signal $SP_{DeFlux}$ for DeFlux phase. Due to different current paths of InFlux phase and DeFlux phase, the first PWCC for InFlux is usually different from the second PWCC for DeFlux.

In an embodiment, the PWM controller may access a first LUT to obtain an InFlux-charging PWCC to generate the PWM signal $SP_{InFlux}$ for the charging operation and access a second LUT to obtain an InFlux-discharging PWCC to generate the PWM signal $SP_{InFlux}$ for the discharging operation. In an embodiment, an InFlux-charging current and a DeFlux-discharging current may have the same current path (e.g., through the switches T1 and T4 shown in FIG. 1) but opposite current directions, and a DeFlux-charging current and an InFlux-discharging current have the same current path (e.g., through the switches T2 and T3 shown in FIG. 1) but opposite current directions. In this case, in an embodiment, the PWM controller may access the second LUT to obtain a DeFlux-charging PWCC to generate the PWM signal $SP_{DeFlux}$ for the charging operation and access the first LUT to obtain a DeFlux-discharging PWCC to generate the PWM signal $SP_{DeFlux}$ for the discharging operation.

U.S. Application No. 18/048,852 further teaches that the PWCC can be retrieved and/or updated while the driving circuit operates. Concept of using control code to specify the current-pulse number K can be incorporated into the present invention.

Figure 6:
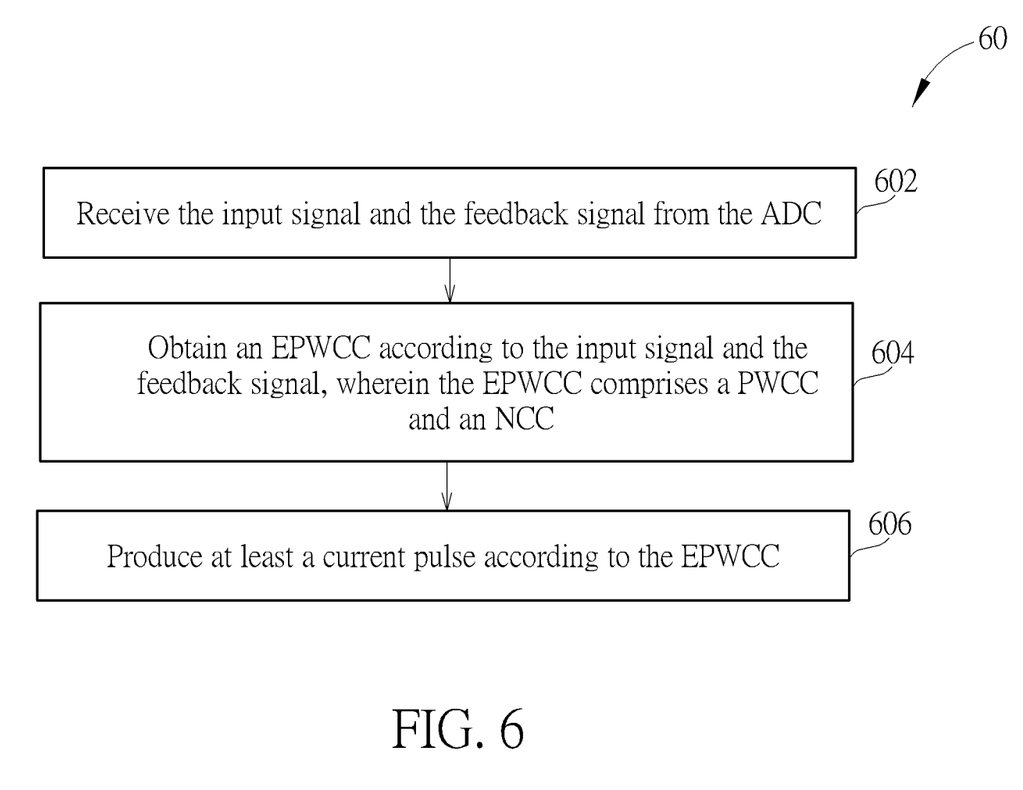
FIG. 6 is a flowchart of a process according to an embodiment of the present invention.

For example, FIG. 6 is a flowchart of a process 60 according to an embodiment of the present invention. The process 60 may be implemented in the driving circuit 10 of the present invention. As shown in FIG. 6, the process 60 includes the following steps:

Step 602: Receive the input signal and the feedback signal from the ADC.

Step 604: Obtain an effective pulse width control code (EPWCC) according to the input signal and the feedback signal, wherein the EPWCC comprises a pulse width control code (PWCC) and a number control code (NCC).

Step 606: Produce at least a current pulse according to the EPWCC.

According to the process 60, the PWM controller 110 may receive the input signal IN and the feedback signal FB from the ADC. Similar to U.S. Pat. No. 11,271,480 and Application No. 18/048,852, the PWM controller 110 would determine a table address according to the input signal IN and the feedback signal FB, and the PWM controller 110 would obtain the EPWCC by referring to a lookup table (LUT) according to the table address. In addition to PWCC, the EPWCC in the present invention further includes an NCC, which is used to specify the current-pulse number K within one ADC cycle $T_{ADC}$. Therefore, the PWM controller 110 may generate a PWM signal (e.g., $SP_{InFlux}$ or $SP_{DeFlux}$ shown in FIG. 2 or FIG. 3) according to the EPWCC, where the PWM signal for one ADC cycle includes K pulse(s) (where K is determined based on the NCC) and each pulse has a pulse width (where the pulse width is determined based on the PWCC).

Figure 7:
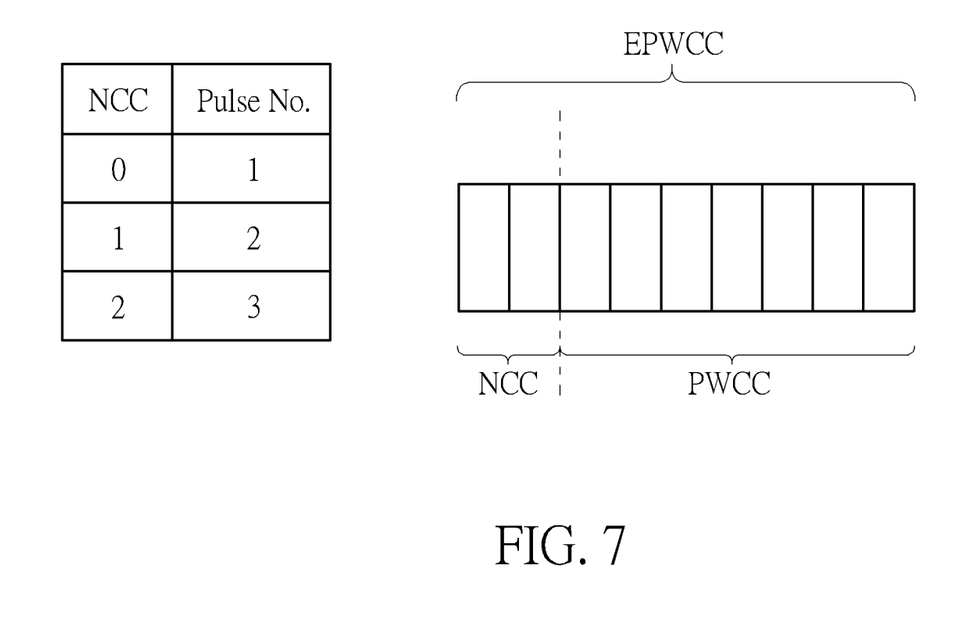
FIG. 7 illustrates an exemplary data field of the EPWCC according to an embodiment of the present invention.

FIG. 7 illustrates an exemplary data field of the EPWCC according to an embodiment of the present invention. In an embodiment, the EPWCC may be a 9-bit data, among which 7 bits are used to store the value of PWCC and 2 bits are used to store the value of NCC. The 2-bit NCC indicates the number of (current) pulses to be produced in one ADC cycle. Supposing that $T_{ADC} = 4 \cdot T_{DC-DC}$, one ADC cycle may include at most 3 DC-DC cycles for DC-DC operations and one ADC slot. As the table shown in FIG. 7, decimal value of NCC being 0 indicates that there is only 1 pulse in the ADC cycle, decimal value of NCC being 1 indicates that there are 2 pulses in the ADC cycle, and decimal value of NCC being 2 indicates that there are 3 pulses in the ADC cycle.

In order to reduce conduction loss, NCC may be increased when PWCC is greater than or equal to a first value. Once NCC is increased, the original PWCC can be reduced to a second (smaller) value. In an embodiment, when PWCC is greater than or equal to the first value (e.g., 107 in decimal), in order to reduce conduction loss, the original current pulse (corresponding to PWCC = 107 in decimal) can be replaced by two small current pulses corresponding to PWCC equal to the second (smaller) value (e.g., 85 in decimal), illustrated as left portion of FIG. 8 and/or as the transition from the leftmost to the middle of FIG. 4.

On the other hand, given a condition that multiple current pulses are produced, in order to spare switching loss, NCC may be decreased when PWCC of the multiple current pulses is less than or equal to a third value. Once NCC is decreased, the original PWCC (of or corresponding to the multiple current pulses) can be enhanced to a fourth value for the fewer enhanced current pulse(s). In an embodiment, when PWCC is less than or equal to the third value (e.g., 81 in decimal) and under the situation that two current pulses are produced, in order to spare switching loss, the original two weaker current pulses (corresponding to PWCC = 81 in decimal) can be replaced by one single enhanced/stronger current pulses corresponding to PWCC equal to the fourth larger value (e.g., 103 in decimal), illustrated as right portion of FIG. 8 and/or as the transition from the middle to the leftmost of FIG. 4.

In U.S. Application No. 18/048,852, PWCC can be updated while the driving circuit operates. In the present invention, NCC can be updated along with the PWCC updating, i.e., EPWCC can be updated while the driving circuit operates. In other words, the PWM controller 110 may receive a first feedback signal FB 1 corresponding to a beginning of an ADC cycle (or current ADC cycle), obtain an address according to the input signal IN and the first feedback signal FB1, fetch an EPWCC from the lookup table (LUT) stored in the memory according to the address, generate a PWM signal (e.g., $SP_{InFlux}$ or $SP_{DeFlux}$) with pulse width corresponding to the EPWCC for the switching circuit to perform the DC-DC operation, receive a second feedback signal FB2 corresponding to an end of the ADC cycle (or the current ADC cycle), update the EPWCC according to the first feedback signal FB1 and the second feedback signal FB2, and save the updated EPWCC back to the LUT in the memory. Herein, the first feedback signal FB1 represents the load voltage $V_{Load}$ before the DC-DC operation(s) corresponding to the current ADC cycle is performed, and the second feedback signal FB2 represents the load voltage $V_{Load}$ after the DC-DC operation(s) corresponding to the current ADC cycle is performed.

Figure 8:
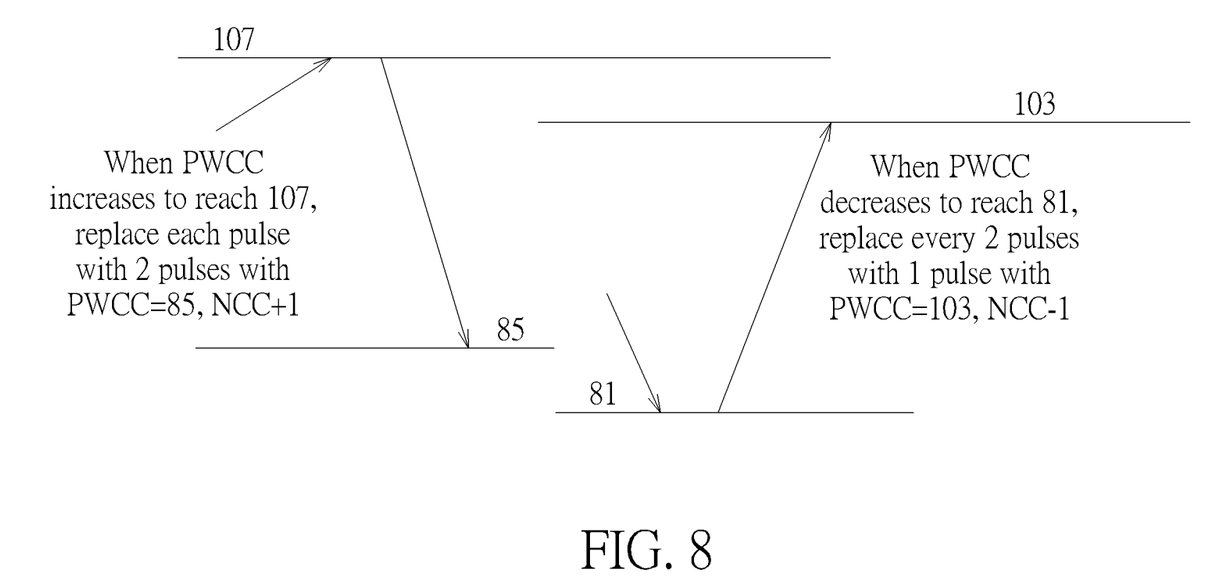
FIG. 8 illustrates (E)PWCC control scheme according to embodiment(s) of the present invention.

During (E)PWCC updating operation under an increasing trend, as shown in the left portion of FIG. 8, when an original PWCC (e.g., corresponding to the single current pulse shown in leftmost of FIG. 4, where NCC = 0) is increased up to reach a first value (e.g., 107 in decimal), the PWCC may be reduced to a second value (e.g., 85 in decimal) and the NCC is increased by 1 (e.g., NCC = 1). In such a situation, for reducing conduction loss, two alternative current pulses with pulse width corresponding to the PWCC=85 are produced, as illustrated in the left portion of FIG. 8 or as the transition from the leftmost to the middle of FIG. 4. Updated EPWCC (with, e.g., increased NCC = 1 and reduced PWCC = 85) would be saved back to the LUT in the memory.

During (E)PWCC updating operation under a decreasing trend, as shown in the right portion of FIG. 8, when an original PWCC (e.g., corresponding to the two current pulses shown in middle of FIG. 4, where NCC =1) is decreased down to attain a third value (e.g., 81 in decimal), the PWCC may be enhanced to a fourth value (e.g., 103 in decimal) and the NCC is decreased by 1 (e.g., NCC = 0). In such a situation, for sparing switching loss, single alternative current pulse with pulse width corresponding to the PWCC=103 is produced, as illustrated in the right portion of FIG. 8 or as the transition from the middle to the leftmost of FIG. 4. Updated EPWCC (with, e.g., decreased NCC = 0 and enhanced PWCC = 103) would be saved back to the LUT in the memory.

Note that, the first, second, third and fourth values above may be determined according to practical situation and are not limited to certain values. For example, hysteresis between the second and third values or hysteresis between the first and fourth values may be incorporated, which is not limited thereto.

Considering multiple current pulses are produced within one ADC cycle $T_{ADC}$, in order to achieve a balance between conduction loss and switching loss, electric charges carried by the multiple current pulses may be distributed evenly over the polarity of current pulses. (Updated) PWCC may be applied to all of the multiple current pulses within the ADC cycle $T_{ADC}$, which means that the multiple current pulses are corresponding to the same PWCC (e.g., for $SP_{InFlux}$), which is not limited thereto.

In an embodiment, the PWM controller may control the switching circuit to produce at least a first current pulse $CP_1$ and at least a second current pulse $CP_2$ within one ADC cycle $T_{ADC}$, where the first current pulse(s) $CP_1$ is corresponding to $PWCC_1$ and the second current pulse(s) $CP_2$ is corresponding to $PWCC_2$, where $PWCC_2 \neq PWCC_1$. To distribute electric charges as even as possible, in an embodiment, $PWCC_1$ may be $PWCC_1 = PWCC_2 + 1$. Herein, $PWCC_1/PWCC_2$ determines pulse width of the PWM signal $SP_{InFlux}$ for current pulse(s) CP1/CP2, which controls rising interval of the current pulse(s) CP1/CP2. In this case, rising interval of the first current pulse(s) $CP_1$ differs from the rising interval of the second current pulse(s) $CP_2$ by 1 unit of PWCC code resolution. Moreover, a number of the first current pulse(s) $CP_1$ may be recorded as a dither control code (DCC) along with EPWCC.

Figure 9:
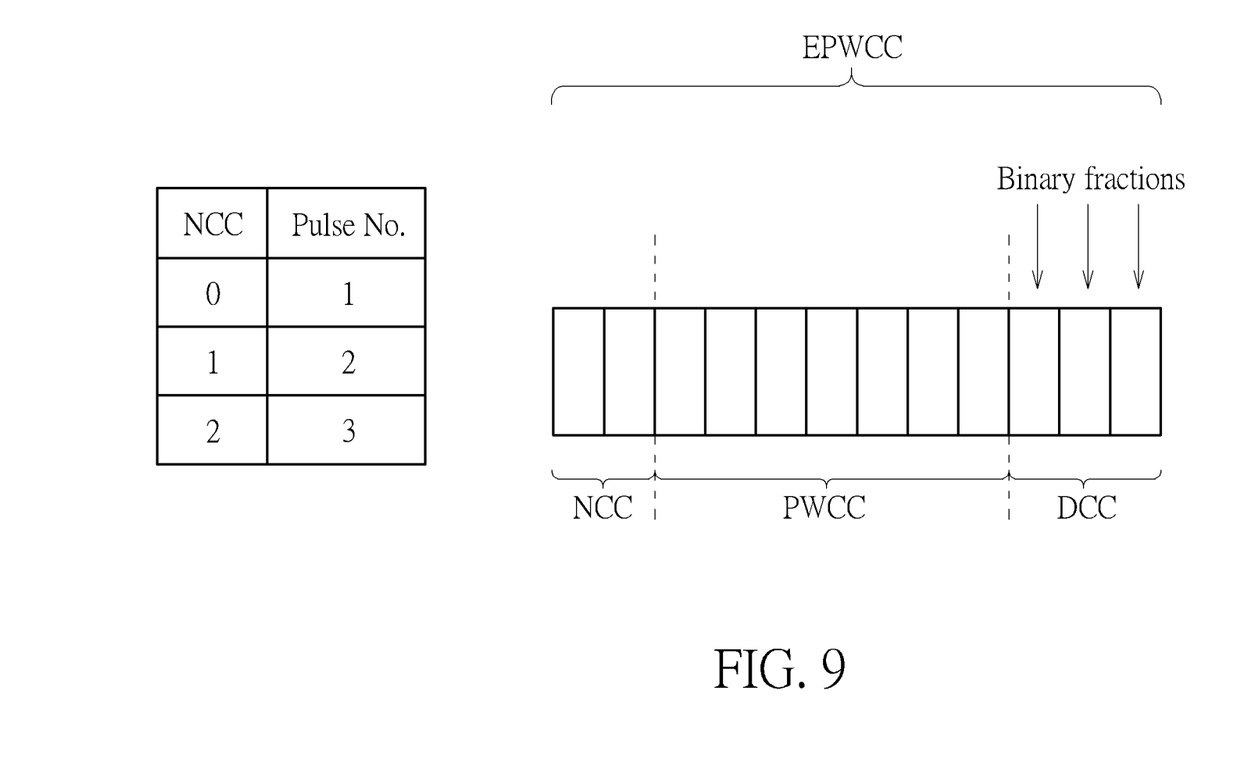
FIG. 9 illustrates another exemplary data field of the EPWCC according to an embodiment of the present invention.

FIG. 9 illustrates another exemplary data field of the EPWCC according to an embodiment of the present invention. In this embodiment, the EPWCC further includes a DCC. The DCC indicates the number of the first current pulse(s) $CP_1$.

For example, supposing that the PWCC is equal to 87 and the NCC value indicates that there are four pulses, and that the DCC indicates the number of pulses having an incremental width, if the DCC equals 0, all pulses of the PWM signal may have the same width corresponding to the value 87. If the DCC equals 1, one of the four pulses may have the width corresponding to the value 88; that is, the PWCC values for these four pulses may become {87, 87, 87, 88}. If the DCC equals 2, the PWCC values for these four pulses may become {87, 87, 88, 88}; if the DCC equals 3, the PWCC values for these four pulses may become {87, 88, 88, 88}. The next level is {88, 88, 88, 88}, which may be realized by modifying the PWCC to 88 and setting the DCC to 0. The above operation may be easily implemented by regarding DCC as binary fractions of the PWCC, so as to achieve a finer resolution of voltage difference within one ADC cycle.

Figure 10:
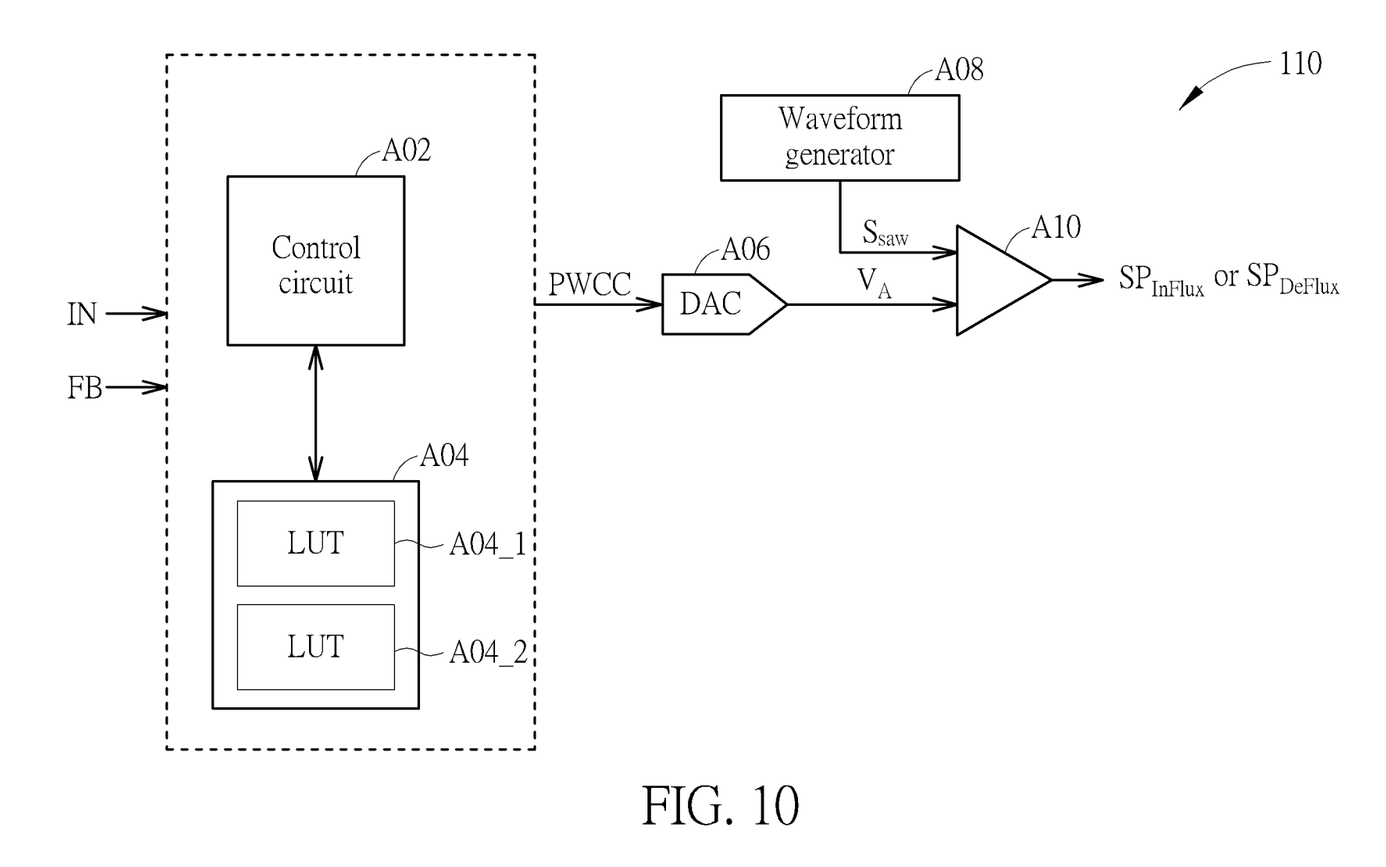
FIG. 10 is a schematic diagram of a PWM controller according to an embodiment of the present invention.

Similar to the teaching from U.S. Pat. No. 11,271,480 and Application No. 18/048,852, the PWM controller 110 may comprise a memory A04, a digital-to-analog converter (DAC) A06, a waveform generator A08 and a comparator A10, as shown in FIG. 10. The waveform generator A08 is configured to generate a sawtooth-like signal (with or without flat tip) $S_{saw}$. The memory A04 is configured to store a first LUT A04_1 and a second LUT A04_2. The first LUT A04_1 may be used for the charging operation and the second LUT A04_2 may be used for the discharging operation. From the memory A04, (E)PWCC may be fetched and PWCC may be output to the DAC A06. The DAC A06 is configured to convert the PWCC into an analog voltage $V_A$. The comparator A10 is configured to compare the sawtooth-like signal $S_{saw}$ with the analog voltage $V_A$, and produce a comparison result as the PWM signal (which may be either $SP_{InFlux}$ or $SP_{DeFlux}$) having a pulse width corresponding to the PWCC.

Note that, referring back to FIG. 2 or FIG. 3, during the charging operation/cycles, the voltage change across the load CL occurs during the 2nd (DeFlux) phase or the falling interval $T_F$; however, during the discharging operation/cycles, the voltage change across the load CL occurs during the 1st (InFlux) phase. In other words, the timing of the current pulses, affecting voltage across terminal of the load CL, is different for the charging cycles and the discharging cycles. When the driving circuit 10 is applied in a density coding system (e.g., a signal density modulation (SDM) or pulse density modulation (PDM) system), which is sensitive not only to the signal level but also to the timing the levels are maintained, such timing difference (between charging current pulse and discharging current pulse) in current pulse timing may cause error in SDM and degrade the SQNR (Signal-to-Quantization-Noise Ratio) performance.

In order to minimize such timing error, in an embodiment, the timing of the discharge cycles may be delayed relative to the timing of the charging cycle, or vice versa. In other words, a timing difference may be imposed between current pulse(s) for the charging operation and which for the discharging operation. In an embodiment, such delay (or timing difference) may be implemented by adding a delay to the start time of the waveform generator A08, but not limited thereto. In an embodiment, such delay may be implemented by imposing a timing shift (delay) on initiate time of current pulses for the discharging operation relative to the charging operation. The amount of the delay may be fixed or may be related/proportional to the PWCC code, and it may further include a random number to breakup timing error patterns.

In other words, to minimize the time error, the PWM controller may control the switching circuit to produce the current pulse(s) CP with a delay, relative to the enveloping non-changing ADC cycle, corresponding to the discharging operation, where there is no such delay within the ADC cycle corresponding to the charging operation, or vice versa. In an embodiment, the amount of the delay may be 0.5n times a clock cycle, where the clock cycle may have a length of $T_{DC-DC}/M$ Herein, both n and M represent integer (e.g., n=1, 2 or 3 and M=12, 18 or 32, but not limited thereto).

Details of SDM can be referred to US. Application No. 17/452,403, and details of PDM are known in the art, which are not narrated herein for brevity.

In summary, the present invention exploits the feature of DC-DC operating rate higher than ADC rate to reserve more time slot(s), such that current pulse number within one ADC cycle is adjustable to minimize power consumption by taking conduction loss and switching loss into consideration.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method applied in a driving circuit comprising an analog-to-digital convertor (ADC) and a switching circuit comprising an inductor and coupled to a load, the method comprising:

performing an analog-to-digital conversion on a load voltage of the load at a first rate; and producing at least a current pulse flowing through the inductor at a second rate;
wherein each current pulse among the at least a current pulse is accomplished within a second cycle corresponding to the second rate;
wherein all of the at least a current pulse are accomplished within a first cycle corresponding to the first rate;
wherein a first length of the first cycle is longer than twice of a second length of the second cycle.

2. The method of claim 1, further comprising:
receiving an input signal and receiving a feedback signal from the ADC; and
producing a plurality of current pulses flowing through the inductor at the second rate within the first cycle when a difference between the input signal and the feedback signal is greater than a threshold.

3. The method of claim 1, further comprising:
receiving an input signal and receiving a feedback signal from the ADC;
increasing a current-pulse number when a difference between the input signal and the feedback signal is greater than a first threshold; and
producing the current pulses with the increased current-pulse number at the second rate within the first cycle.

4. The method of claim 1, further comprising:
receiving an input signal and receiving a feedback signal from the ADC;
decreasing a current-pulse number when a difference between the input signal and the feedback signal is less than a second threshold; and
producing the at least a current pulse with the decreased current-pulse number at the second rate within the first cycle.

5. The method of claim 1, further comprising:
receiving an input signal and receiving a feedback signal from the ADC;
obtaining an effective pulse width control code (EPWCC) according to the feedback signal and the input signal from a table stored in a memory, wherein the EPWCC comprises a pulse width control code (PWCC) and a number control code (NCC); and
producing the at least a current pulse according to the EPWCC.

6. The method of claim 5, wherein the step of producing the at least a current pulse according to the EPWCC comprises:
producing a current pulse among the at least a current pulse with a rising interval, wherein the rising interval is determined according to the PWCC within the EPWCC; and
producing the at least a current pulse with a current-pulse number, wherein the current-pulse number is determined according to the NCC within the EPWCC.

7. The method of claim 5, wherein the step of producing the current pulse comprises:
generating a pulse width modulation (PWM) signal with a pulse width to the switching circuit;
wherein the pulse width of the PWM signal is determined according to the PWCC.

8. The method of claim 5, further comprising:
receiving a first feedback signal corresponding to a beginning of the first cycle and a second feedback signal corresponding to an end of the first cycle;
updating the EPWCC according to the first feedback signal and the second feedback signal; and
saving the updated EPWCC back to the table in the memory.

9. The method of claim 8,
wherein the step of updating the EPWCC comprises:
increasing the NCC when the PWCC is increased to be greater than or equal to a first value; and
replacing the increased PWCC with a reduced PWCC when the NCC is increased, wherein the reduced PWCC has a second value less than the first value;
wherein the step of saving the updated EPWCC back to the table in the memory comprises: saving the increased NCC and the reduced PWCC back to the table in the memory.

10. The method of claim 8, further comprising:
wherein the step of updating the EPWCC comprises:
decreasing the NCC when the PWCC is decreased to be less than or equal to a third value; and
replacing the decreased PWCC with an enhanced PWCC when the NCC is decreased, wherein the enhanced PWCC has a fourth value greater than the third value; and
wherein the step of saving the updated EPWCC back to the table in the memory comprises:
saving the decreased NCC and the enhanced PWCC back to the table in the memory.

11. The method of claim 1, further comprising:
producing at least a first current pulse and at least a second current pulse within the first cycle corresponding to the first rate;
wherein a first rising interval of the at least a first current pulse is greater than a second rising interval of the at least a second current pulse.

12. The method of claim 1, further comprising:
producing the at least a current pulse with a delay within the first cycle corresponding to a discharging operation.

13. A driving circuit, configured to drive a load, the driving circuit comprising:
an analog-to-digital convertor (ADC), configured to perform an analog-to-digital conversion on a load voltage of the load at a first rate; and
a switching circuit, comprising an inductor and coupled to a load, configured to produce at least a current pulse flowing through the inductor at a second rate;
wherein each current pulse among the at least a current pulse is accomplished within a second cycle corresponding to the second rate;
wherein all of the at least a current pulse are accomplished within a first cycle corresponding to the first rate;
wherein a first length of the first cycle is longer than twice of a second length of the second cycle.

14. The driving circuit of claim 13, further comprising:
a pulse width modulation (PWM) controller, receiving an input signal and receiving a feedback signal from the ADC;
wherein the PWM controller controls the switching circuit to produce a plurality of current pulses flowing through the inductor at the second rate within the first cycle when a difference between the input signal and the feedback signal is greater than a threshold.

15. The driving circuit of claim 13, further comprising:
a pulse width modulation (PWM) controller, receiving an input signal and receiving a feedback signal from the ADC;
wherein the PWM controller increases a current-pulse number when a difference between the input signal and the feedback signal is greater than a first threshold;
wherein the PWM controller controls the switching circuit to produces the current pulses with the increased current-pulse number at the second rate within the first cycle.

16. The driving circuit of claim 13, further comprising:

a pulse width modulation (PWM) controller, receiving an input signal and receiving a feedback signal from the ADC;

wherein the PWM controller decreases a current-pulse number when a difference between the input signal and the feedback signal is less than a second threshold;

wherein the PWM controller controls the switching circuit to produce the at least a current pulse with the decreased current-pulse number at the second rate within the first cycle.

17. The driving circuit of claim 13, further comprising:

a pulse width modulation (PWM) controller, receiving an input signal and receiving a feedback signal from the ADC;

wherein the PWM controller comprises a memory, configured to store a table;

wherein the PWM controller obtains an effective pulse width control code (EPWCC) according to the feedback signal and the input signal from the table stored in the memory;

wherein the EPWCC comprises a pulse width control code (PWCC) and a number control code (NCC);

wherein the switching circuit produces the at least a current pulse according to the EPWCC.

18. The driving circuit of claim 17, wherein the PWM controller determines a rising interval according to the PWCC and a current-pulse number of the plurality of current pulses according to the NCC;

wherein the switching circuit produces a current pulse among the at least a current pulse with the rising interval, and produces the at least a current pulse with the current-pulse number.

19. The driving circuit of claim 17, wherein the PWM controller generates a PWM signal with a pulse width corresponding to the PWCC to the switching circuit.

20. The driving circuit of claim 17, wherein the PWM controller receives a first feedback signal corresponding to a beginning of the first cycle and a second feedback signal corresponding to an end of the first cycle;

wherein the PWM controller updates the EPWCC according to the first feedback signal and the second feedback signal; and wherein the PWM controller saves the updated EPWCC back to the table in the memory.

21. The driving circuit of claim 20, wherein during the PWM controller updating the EPWCC, the PWM controller increases the NCC when the PWCC is increased to be greater than or equal to a first value and replaces the increased PWCC with a reduced PWCC when the NCC is increased;

wherein the reduced PWCC has a second value less than the first value; and wherein the PWM controller saves the increased NCC and the reduced PWCC back to the table in the memory.

22. The driving circuit of claim 20, wherein during the PWM controller updating the EPWCC, the PWM controller decreases the NCC when the PWCC is decreased to be less than or equal to a third value and replaces the decreased PWCC with an enhanced PWCC when the NCC is decreased;

wherein the enhanced PWCC has a fourth value greater than the third value; and wherein the PWM controller saves the decreased NCC and the enhanced PWCC back to the table in the memory.

23. The driving circuit of claim 13, wherein the switching circuit produces at least a first current pulse and at least a second current pulse within the first cycle corresponding to the first rate;

wherein a first rising interval of the at least a first current pulse is greater than a second rising interval of the at least a second current pulse.

24. The driving circuit of claim 17, wherein the PWM controller comprises:

a digital-to-analog converter (DAC), configured to convert the PWCC into an analog voltage;

a waveform generator, configured to generate a sawtooth-like signal; and a comparator, configured to compare the sawtooth-like signal with the analog voltage, and produce a comparison result as a PWM signal having a pulse width corresponding to the PWCC.

25. The driving circuit of claim 13, wherein the switching circuit comprises:

a first switch, coupled between a voltage source and a first terminal of the inductor;

a second switch, coupled to the first terminal of the inductor;

a third switch, coupled between the load and a second terminal of the inductor; and a fourth switch, coupled to the second terminal of the inductor.

26. The driving circuit of claim 13, wherein the switching circuit is coupled between the load and a voltage source;

wherein during a discharging operation, the switching circuit forms a current toward the voltage source.

27. The driving circuit of claim 13, wherein the second rate is a multiple of the first rate.

28. The driving circuit of claim 13, wherein the load is a capacitive speaker load, the input signal is generated according to an original audio signal within an audible band, and an output of the capacitive speaker load is substantially proportional to the input signal.

29. The driving circuit of claim 13, further comprising:

a pulse width modulation (PWM) controller, receiving an input signal and receiving a feedback signal from the ADC;

wherein the PWM controller controls the switching circuit to produce the at least a current pulse with a delay within the first cycle corresponding to a discharging operation.

* * * * *